US012379414B2

(12) United States Patent
Pickerd et al.

(10) Patent No.: US 12,379,414 B2
(45) Date of Patent: Aug. 5, 2025

(54) SYSTEM AND METHOD FOR MULTI-LEVEL SIGNAL CYCLIC LOOP IMAGE REPRESENTATIONS FOR MEASUREMENTS AND MACHINE LEARNING

(71) Applicant: Tektronix, Inc., Beaverton, OR (US)

(72) Inventors: John J. Pickerd, Hillsboro, OR (US); Williams Fabricio Flores Yepez, Pittsburgh, PA (US)

(73) Assignee: Tektronic, Inc., Beaverton, OR (US)

( * ) Notice: Subject to any disclaimer, the term of this patent is extended or adjusted under 35 U.S.C. 154(b) by 1091 days.

(21) Appl. No.: 17/345,312

(22) Filed: Jun. 11, 2021

(65) Prior Publication Data

US 2021/0389373 A1  Dec. 16, 2021

Related U.S. Application Data

(60) Provisional application No. 63/177,930, filed on Apr. 21, 2021, provisional application No. 63/041,041,
(Continued)

(51) Int. Cl.
*G01R 31/319* (2006.01)
*G01R 13/02* (2006.01)
(Continued)

(52) U.S. Cl.
CPC ... *G01R 31/31908* (2013.01); *G01R 13/0272* (2013.01); *G01R 31/31708* (2013.01);
(Continued)

(58) Field of Classification Search
None
See application file for complete search history.

(56) References Cited

U.S. PATENT DOCUMENTS 5,272,723 A  12/1993  Kimoto
5,397,981 A   3/1995  Wiggers
(Continued)

FOREIGN PATENT DOCUMENTS

CN  107342810  11/2019
EP    2743710   9/2018
(Continued)

OTHER PUBLICATIONS

Korean Intellectual Property Office, International Search Report and Written Opinion for International Application No. PCT/US2021/036968, Sep. 29, 2021, 8 pages, Daejeon, Republic of Korea.
(Continued)

*Primary Examiner* — Raymond L Nimox
(74) *Attorney, Agent, or Firm* — Miller Nash LLP; Andrew J. Harrington

(57) ABSTRACT

A system includes an input to receive a digital waveform signal, a memory, and one or more processors configured to execute code to cause the one or more processors to: generate a horizontal ramp sweep signal based on the digital waveform signal; receive a selection input to identify a segment of the digital waveform signal; gate the horizontal ramp sweep signal and the digital waveform signal based on the selection input to produce cyclic loop image data for the segment of the digital waveform; store the cyclic loop image data in the memory; and provide the cyclic loop image data as one or more inputs into a machine learning system. A method of waveform classification using a cyclic loop image includes receiving an input waveform, receiving a selection of a segment of the input waveform, transforming the segment of the input waveform into cyclic loop image data, the transforming comprising generating a horizontal ramp sweep signal based on edge transitions in the input waveform, and storing the cyclic loop image data in a memory;
(Continued)

and sending the cyclic loop image data to a machine learning system to determine an attribute of the input waveform.

20 Claims, 11 Drawing Sheets

Related U.S. Application Data filed on Jun. 18, 2020, provisional application No. 63/039,360, filed on Jun. 15, 2020, provisional application No. 63/038,040, filed on Jun. 11, 2020.

(51) Int. Cl.
  *G01R 31/317* (2006.01)
  *G06F 18/20* (2023.01)
  *G06N 20/00* (2019.01)

(52) U.S. Cl.
  CPC ....... *G01R 31/31905* (2013.01); *G06F 18/20* (2023.01); *G06N 20/00* (2019.01); *G06F 2218/16* (2023.01)

(56) References Cited

U.S. PATENT DOCUMENTS

| | | | |
|---|---|---|---|
| 5,594,655 | A | 1/1997 | Berchin |
| 6,807,496 | B2 | 10/2004 | Pickerd |
| 7,181,146 | B1 | 2/2007 | Yorks |
| 7,298,463 | B2 | 11/2007 | French |
| 8,583,395 | B2 | 11/2013 | Dybsetter |
| 8,861,578 | B1 | 10/2014 | Lusted |
| 9,059,803 | B2 | 6/2015 | Detofsky |
| 9,130,751 | B2 | 9/2015 | Zivny |
| 9,337,993 | B1 | 5/2016 | Lugthart |
| 9,548,858 | B1 | 1/2017 | Cirit |
| 9,699,009 | B1 | 7/2017 | Ainspan |
| 9,709,605 | B2 | 7/2017 | Alley |
| 10,171,161 | B1 | 1/2019 | Cote |
| 10,209,276 | B2 | 2/2019 | Tan |
| 10,236,982 | B1 | 3/2019 | Zhuge |
| 10,270,527 | B1 | 4/2019 | Mentovich |
| 10,396,897 | B1 | 8/2019 | Malave |
| 10,585,121 | B2 | 3/2020 | Absher |
| 10,727,973 | B1 | 7/2020 | Kumar |
| 10,852,323 | B2 | 12/2020 | Schaefer |
| 10,863,255 | B2 | 12/2020 | Zhang |
| 11,005,697 | B2 | 5/2021 | Liston |
| 11,040,169 | B2 | 6/2021 | Jung |
| 11,095,314 | B2 | 8/2021 | Medard |
| 11,177,986 | B1 | 11/2021 | Ganesan |
| 11,233,561 | B1 | 1/2022 | O'Shea |
| 11,237,190 | B2 | 2/2022 | Rule |
| 11,336,378 | B2 | 5/2022 | Buttoni |
| 11,388,081 | B1 | 7/2022 | Sommers |
| 11,476,967 | B2 | 10/2022 | Geng |
| 11,646,863 | B2 | 5/2023 | Balan |
| 11,695,601 | B2 | 7/2023 | Sudhakaran |
| 2002/0063553 | A1 | 5/2002 | Jungerman |
| 2003/0053170 | A1 | 3/2003 | Levinson |
| 2003/0208330 | A1 | 11/2003 | Pickerd |
| 2003/0220753 | A1 | 11/2003 | Pickerd |
| 2004/0032889 | A1 | 2/2004 | Hidaka |
| 2004/0121733 | A1 | 6/2004 | Peng |
| 2004/0131365 | A1 | 7/2004 | Lee |
| 2004/0136422 | A1 | 7/2004 | Mahowald |
| 2004/0165622 | A1 | 8/2004 | Lu |
| 2004/0223544 | A1 | 11/2004 | Upton |
| 2004/0236527 | A1 | 11/2004 | Felps |
| 2005/0222789 | A1 | 10/2005 | West |
| 2005/0246601 | A1 | 11/2005 | Waschura |
| 2005/0249252 | A1 | 11/2005 | Sanchez |
| 2006/0120720 | A1 | 6/2006 | Hauenschild |
| 2006/0224365 | A1* | 10/2006 | Pickerd ............. G01R 13/0272 702/190 |
| 2008/0126001 | A1 | 5/2008 | Murray |
| 2008/0159737 | A1 | 7/2008 | Noble |
| 2008/0212979 | A1 | 9/2008 | Ota |
| 2009/0040335 | A1 | 2/2009 | Ito |
| 2011/0085793 | A1 | 4/2011 | Oomori |
| 2011/0161738 | A1 | 6/2011 | Zhang |
| 2011/0286506 | A1 | 11/2011 | Libby |
| 2012/0226727 | A1 | 9/2012 | Zivny |
| 2013/0046805 | A1 | 2/2013 | Smith et al. |
| 2014/0093233 | A1 | 4/2014 | Gao |
| 2014/0163914 | A1 | 6/2014 | Alley |
| 2014/0343883 | A1 | 11/2014 | Libby |
| 2015/0003505 | A1 | 1/2015 | Lusted |
| 2015/0055694 | A1 | 2/2015 | Juenemann |
| 2015/0207574 | A1 | 7/2015 | Schoen |
| 2015/0350042 | A1 | 12/2015 | Zivny |
| 2016/0191168 | A1 | 6/2016 | Huang |
| 2016/0328501 | A1 | 11/2016 | Chase |
| 2018/0006721 | A1 | 1/2018 | Ishizaka |
| 2018/0045761 | A1 | 2/2018 | Tan |
| 2018/0074096 | A1 | 3/2018 | Absher et al. |
| 2018/0204117 | A1 | 7/2018 | Brevdo |
| 2018/0219636 | A1 | 8/2018 | Gale |
| 2018/0356655 | A1 | 12/2018 | Welch |
| 2019/0038387 | A1 | 2/2019 | Chu et al. |
| 2019/0278500 | A1 | 9/2019 | Lakshmi |
| 2019/0332941 | A1 | 10/2019 | Towal |
| 2019/0370158 | A1 | 12/2019 | Rivoir |
| 2019/0370631 | A1 | 12/2019 | Fais |
| 2020/0035665 | A1 | 1/2020 | Chuang |
| 2020/0057824 | A1 | 2/2020 | Yeh |
| 2020/0166546 | A1 | 5/2020 | O'Brien |
| 2020/0195353 | A1 | 6/2020 | Ye |
| 2020/0229206 | A1 | 7/2020 | Badic |
| 2020/0313999 | A1 | 10/2020 | Lee |
| 2020/0335029 | A1 | 10/2020 | Gao |
| 2021/0041499 | A1 | 2/2021 | Ghosal |
| 2021/0105548 | A1 | 4/2021 | Ye |
| 2021/0111794 | A1 | 4/2021 | Huang |
| 2021/0160109 | A1 | 5/2021 | Seol |
| 2021/0167864 | A1 | 6/2021 | Razzell |
| 2021/0314081 | A1 | 10/2021 | Shattil |
| 2021/0389373 | A1 | 12/2021 | Pickerd |
| 2021/0390456 | A1 | 12/2021 | Pickerd |
| 2022/0070040 | A1 | 3/2022 | Namgoong |
| 2022/0076715 | A1 | 3/2022 | Lee |
| 2022/0121388 | A1 | 4/2022 | Woo |
| 2022/0182139 | A1 | 6/2022 | Zhang |
| 2022/0199126 | A1 | 6/2022 | Lee |
| 2022/0200712 | A1 | 6/2022 | Lillie |
| 2022/0215865 | A1 | 7/2022 | Woo |
| 2022/0236326 | A1 | 7/2022 | Schaefer |
| 2022/0239371 | A1 | 7/2022 | Xu |
| 2022/0247648 | A1 | 8/2022 | Pickerd |
| 2022/0311513 | A1 | 9/2022 | Pickerd |
| 2022/0311514 | A1 | 9/2022 | Smith |
| 2022/0334180 | A1 | 10/2022 | Pickerd |
| 2022/0373597 | A1 | 11/2022 | Agoston |
| 2022/0373598 | A1 | 11/2022 | Tan |
| 2022/0385374 | A1 | 12/2022 | Arikawa |
| 2022/0390515 | A1 | 12/2022 | Pickerd |
| 2022/0393914 | A1 | 12/2022 | Tan |
| 2022/0407595 | A1 | 12/2022 | Varughese |
| 2023/0050162 | A1 | 2/2023 | Tan |
| 2023/0050303 | A1 | 2/2023 | Pickerd |
| 2023/0052588 | A1 | 2/2023 | Sudhakaran |
| 2023/0088409 | A1 | 3/2023 | Parsons |
| 2023/0098379 | A1 | 3/2023 | Smith |
| 2023/0194599 | A1 | 6/2023 | Gilabert |
| 2023/0228803 | A1 | 7/2023 | Sun |
| 2023/0239182 | A1 | 7/2023 | Ikeda |
| 2023/0299862 | A1 | 9/2023 | O'Shea |
| 2023/0306578 | A1 | 9/2023 | Pickerd |

FOREIGN PATENT DOCUMENTS

| | | |
|---|---|---|
| EP | 3936877 | 1/2022 |
| JP | 6560793 | 8/2019 |

(56) References Cited

FOREIGN PATENT DOCUMENTS

| WO | 2021092156 | 5/2021 |
|----|------------|--------|
| WO | 2022171645 | 8/2022 |
| WO | 2022189613 | 9/2022 |

OTHER PUBLICATIONS

Varughese, Siddarth, et al., Accelerating Assessments of Optical Components Using Machine Learning: TDECQ as Demonstrated Example, Journal of Lightwave Technology, Jan. 1, 2021, pp. 64-72, vol. 39, No. 1, IEEE.

Varughese, Siddarth, et al., Accelerating TDECQ Assessments using Convolutional Neural Networks, OFC, Mar. 2020, 3 pages, The Optical Society (OSA).

Watts et al., "Performance of Single-Mode Fiber Links Using Electronic Feed-Forward and Decision Feedback Equalizers", 2005, IEEE Photonics Techology Letters, vol. 17, No. 10, pp. 2206-2208 (Year: 2005).

Echeverri-Chacon et al., "Transmitter and Dispersion Eye Closure Quaternary (TDECQ) and Its Sensitivity to Impairments in PAM4 Waveforms", 2019, Journal of Lightwave Technology, vol. 37, No. 3, pp. 852-860 (Year: 2019).

Wang et al., "Intelligent Constellation Diagram Analyzer Using Convolutional Neural Network-Based Deep Learning," Optics Express, Jul. 24, 2017, vol. 25, No. 15.

\* cited by examiner

SYSTEM AND METHOD FOR MULTI-LEVEL SIGNAL CYCLIC LOOP IMAGE REPRESENTATIONS FOR MEASUREMENTS AND MACHINE LEARNING

RELATED APPLICATIONS

This disclosure claims the benefit of U.S. Provisional Pat. App. No. 63/038,040, titled "PAM4 CYCLIC EYE IMAGE REPRESENTATION FOR WAVEFORM DATA," filed Jun. 11, 2020, U.S. Provisional Pat. App. No. 63/039,360, titled "READ/WRITE BURST SEPARATION AND MEASUREMENT USING NOVEL CYCLIC EYE PLOT AND MACHINE LEARNING," filed Jun. 15, 2020, U.S. Provisional Pat. App. No. 63/041,041, titled "CYCLIC EYE IMAGE REPRESENTATION FOR WAVEFORM DATA," filed Jun. 18, 2020, and U.S. Provisional Pat. App. No. 63/177,930, titled "CYCLIC EYE WITH MACHINE LEARNING FOR MEASURING OR TUNING AN OPTICAL TRANSMITTER," filed Apr. 21, 2021, each of which hereby incorporated herein by reference in their entirety.

This disclosure is related to the following patent applications: U.S. patent application Ser. No. 17/345,342, filed Jun. 11, 2021, with the title, "SYSTEM AND METHOD FOR SEPARATION AND CLASSIFICATION OF SIGNALS USING CYCLIC LOOP IMAGES" and U.S. patent application Ser. No. 17/345,283, filed Jun. 11, 2021, with the title, "A CYCLIC LOOP IMAGE REPRESENTATION FOR WAVEFORM DATA,".

TECHNICAL FIELD

This disclosure relates to generation of images for signals analysis and measurement, more particularly to transformation of multilevel and/or pulse-amplitude modulation signal waveforms into images useable for measurements and machine learning.

BACKGROUND

In the early days of oscilloscopes, Lissajous figures using XY sweeps from two different signals were a popular way to view some phase and frequency characteristics of signals. The signals included sinusoidal or square wave signals of the same frequency, or of different, but correlated, frequencies. The image had a primary characteristic of a single closed loop, cyclic path. The signal repeated over this path with each cycle in cases where X and Y have the same frequency. FIG. 1 shows an example of such an image 10 resulting from two input signals 12 and 14.

Another example of an XY cyclic-type plot results from observation of magnetic BH curves on an oscilloscope display. B refers to the magnetic flux density and H refers to the field intensity. The resulting cyclic loop on the display shows the hysteresis effect of the magnetization of the magnetic core material. In both of the above cases, the input signals are periodic, not random, and the X and Y axes are not directly linear unless the signal is linear.

Major advancements in processors have resulted in the processors reaching incredible speeds. This in turn leads to the ability to make artificial intelligence processes such as deep learning and machine learning practical to implement.

Modern communications systems commonly use serial data links to transmit periodic clocks or pseudo-random binary sequences (PRBS). Oscilloscope displays, usually in the measurement over time, y(t) or YT, mode display signal diagrams for use in analysis and visualizations. These diagrams for serial data signals often take a shape similar to an eye, so are referred to as eye diagrams. FIG. 2 shows an example of such an eye diagram, with an "eye" opening 16.

The oscilloscope typically creates the eye diagram over a time interval of two unit intervals (UI), where one UI equals one symbol interval on the time axis of the waveform display. In these images, the symbol transitions are overlaid, resulting in a positive edge and a negative edge crossing on the left side of the display and again on the right side.

Generally, machine learning (ML) networks or systems operate well on image data. However, traditional eye diagram images may not work well in ML networks. The traditional eye diagram images have redundant data points, a high degree of overlay across the top and bottom of the signal, and positive edges overlay negative edges with a crossing point. This tends to smear and obscure the edge shapes that define the system transfer function, which becomes especially true as the inter-symbol interference (ISI) increases. Further, these types of diagrams focus on the opening of the eye in the middle of the display as the primary area of interest. To apply ML techniques in this type of situation, the systems require better images.

Embodiments of the disclosed apparatus and methods address shortcomings in the prior art.

DETAILED DESCRIPTION

Figure 1:
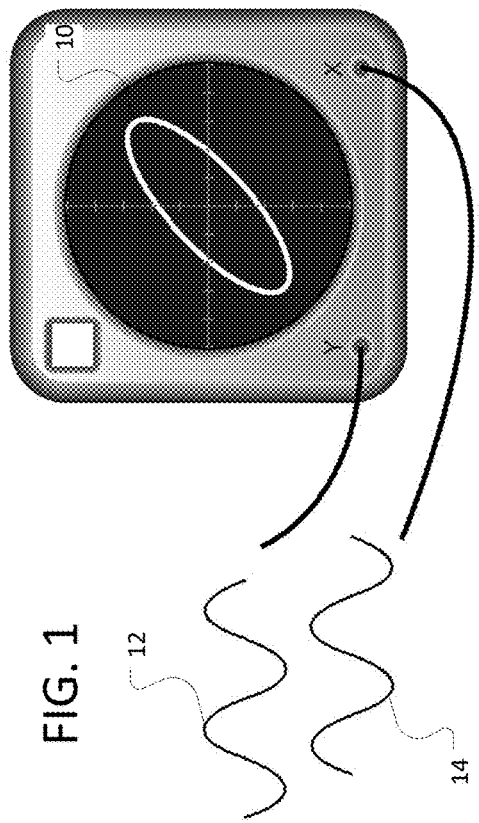
FIG. 1 shows an example of a Lissajous figure.
Figure 2:
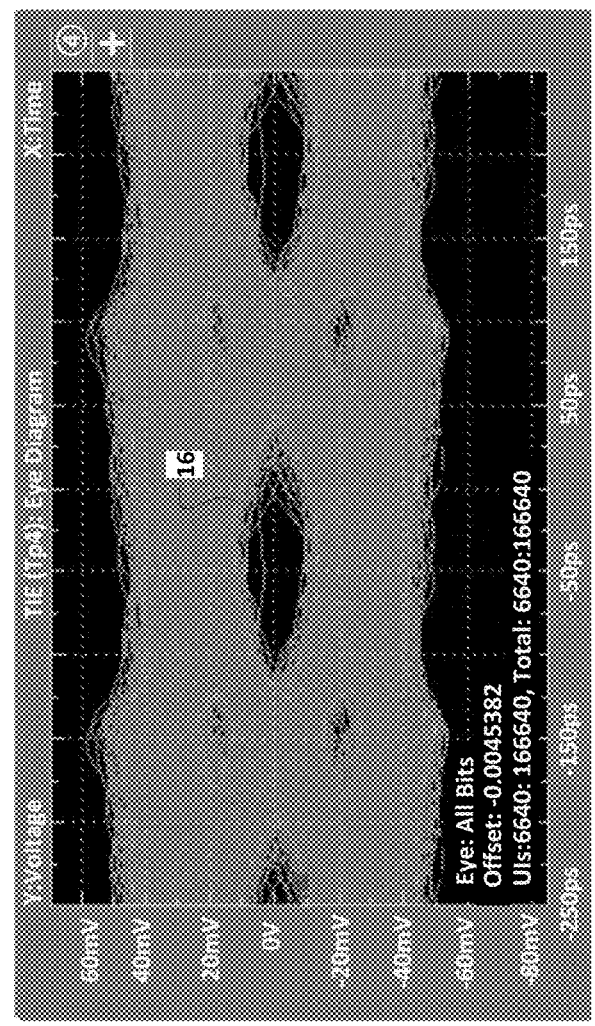
FIG. 2 shows an example of an eye diagram plot.

The embodiments address the problem of separating out edges of a multilevel signal such as pulse-amplitude modulation signals, like PAM4, so that that system characteristics such as intersymbol interference (ISI) and reflections, are more readily usable for human observation, measurements, as well as for machine learning waveform classification systems. The embodiments describe a unique cyclic loop representation to create an image for use in identifying signals and facilitating some measurements.

The cyclic loop is an XY image plot that is more sparse than typical eye diagrams. The cyclic loop of these embodiments focuses on the edges that contain most of the information that characterizes the system response. For non-return-to-zero (NRZ) signals there is one cyclic loop closed-loop path. PAM4 signals have three closed-loops paths covering single-level transitions at three vertical offsets, two closed-loop paths covering double-level transitions at two vertical offsets, and one closed-loop path covering triple-level transitions with no vertical offset. The embodiments provide a means for observing these paths overlaid in a single image, or for separating out any of the individual closed loop paths into separate images. These cyclic loop images are well-suited for input to existing pre-trained neural networks that can adapt to the new images, process, and classify the waveforms based on these images.

For purposes of this discussion, deep learning is generally considered a subset of machine learning (ML), and machine learning is generally considered a subset of artificial intelligence (AI). Deep learning neural networks could process images for waveform classification based on a system transfer function. However, these networks need a better image than a traditional eye diagram. For example, one application using NRZ signals would identify and separate read and write bursts. These bursts have different transfer functions for each operation, including different gain, transmission loss as viewed by a probe and interposer at the memory package position, and different reflection delay and reflection coefficients. The cyclic loop embodiments here allow better viewing and classification of these properties.

The problem of having two different transfer functions depending upon direction of data flow exists in other types of serial links in the electronics industry. The observed difference in transfer function partly results from placement of oscilloscope probes at one end of the line. At high frequencies, a transmitted signal from the other end has high loss through the transmission line. When the device at the probe end transmits, the signal is not attenuated by the transmission loss as seen by the probe.

The embodiments may also be useful in unidirectional signal analysis, especially in making some measurements on the waveform such as reflection delay, reflection coefficients, and waveform linearity. For the latter, the system may be non-stationary and therefore non-linear as the rise times and edge shape may differ for rising edges compared to falling edges. Symmetry may be different. The cyclic loop of the embodiments provides a view that helps visualize and analyze various waveform parameters. While the discussion here focuses on PAM4 signals, the embodiments may apply other types of signals.

Figure 3:
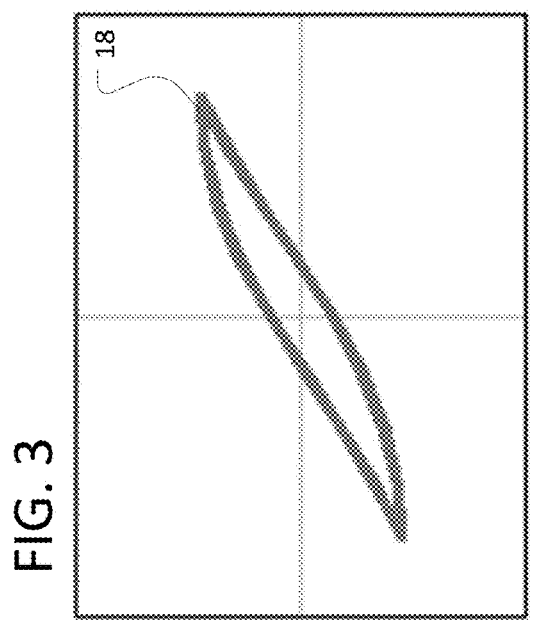
FIG. 3 shows an embodiment of a cyclic loop image for a two-level non-return-to-zero (NRZ) signal.

The embodiments here may result in an XY cyclic loop plot, or image, of a PAM4 signal. The vertical Y-axis is the signal itself. The horizontal X-axis consists of a set of positively and negatively sloped linear ramps that occur only on the input signal edge transitions. FIG. 3 shows an example of a cyclic loop 18. The embodiments here use novel processing to create a linear or somewhat linear ramp sweep signal on the X-axis only at all edge transitions in the input data pattern.

The embodiments here position triggers for these ramps such that the XY signal path consists of a closed loop line containing all rising edges above the upper side of the loop and all negative going edges on the lower side of the loop shown in FIG. 3. This configuration is for when the clock trigger ramp delay of the PRBS signal is greater than zero. For situations in which the delay is less than zero, negative edges are on the upper path of the loop and positive edges are on the lower path. When clock delay equals zero the positive edges overlay on top of the negative edges and no middle area in the loop.

For machine learning applications and for symmetry observation a control in a menu system may allow the user to offset clock trigger ramp delay, such that the positive and negative edges do not overlay, while maintaining a repetitive cyclic loop path.

Since edges in the system contain most of the information defining the system transfer function, this simpler image results in a cyclic loop display that captures all cycles of the waveform in one image and yet it eliminates a lot of extra unnecessary data points that a traditional eye diagram would contain. The resulting plot may, depending on the waveform characteristics, have appearance similarities to magnetic hysteresis BH plots, however, the specifics of the horizontal ramp creation have unique methods of generation and how it applies to PRBS data patterns.

Figure 4:
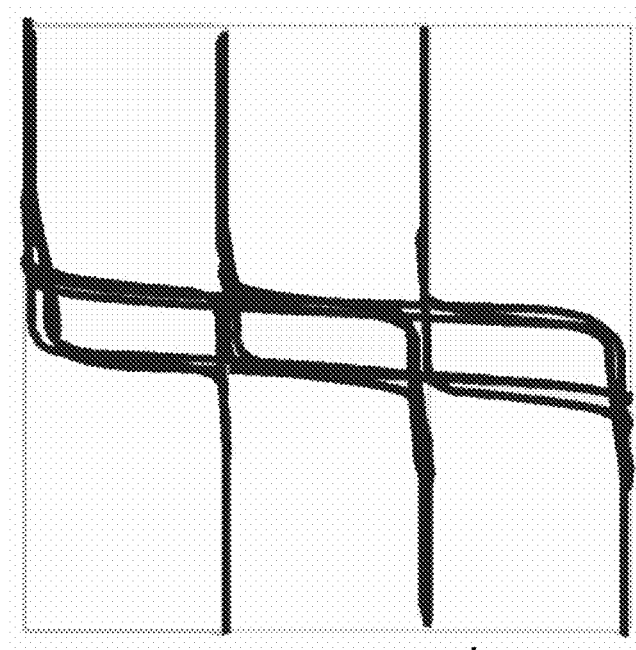
FIG. 4 shows an embodiment of a cyclic loop image for a 4-level pulse-amplitude modulated (PAM4) signal including all loops and all transition levels.

Machine learning systems function better with reduced data sets, sometimes referred to as reduced dimensionality or data reduction. FIG. 4 shows a resulting simplified cyclic loop plot that may be used to determine signal attributes such as the system response, non-linearity for rising compared to falling edges, ISI, signal-to-noise ratio (SNR), amplitude, reflection delay, reflection coefficient, and rise and fall times, among others.

Figure 5:
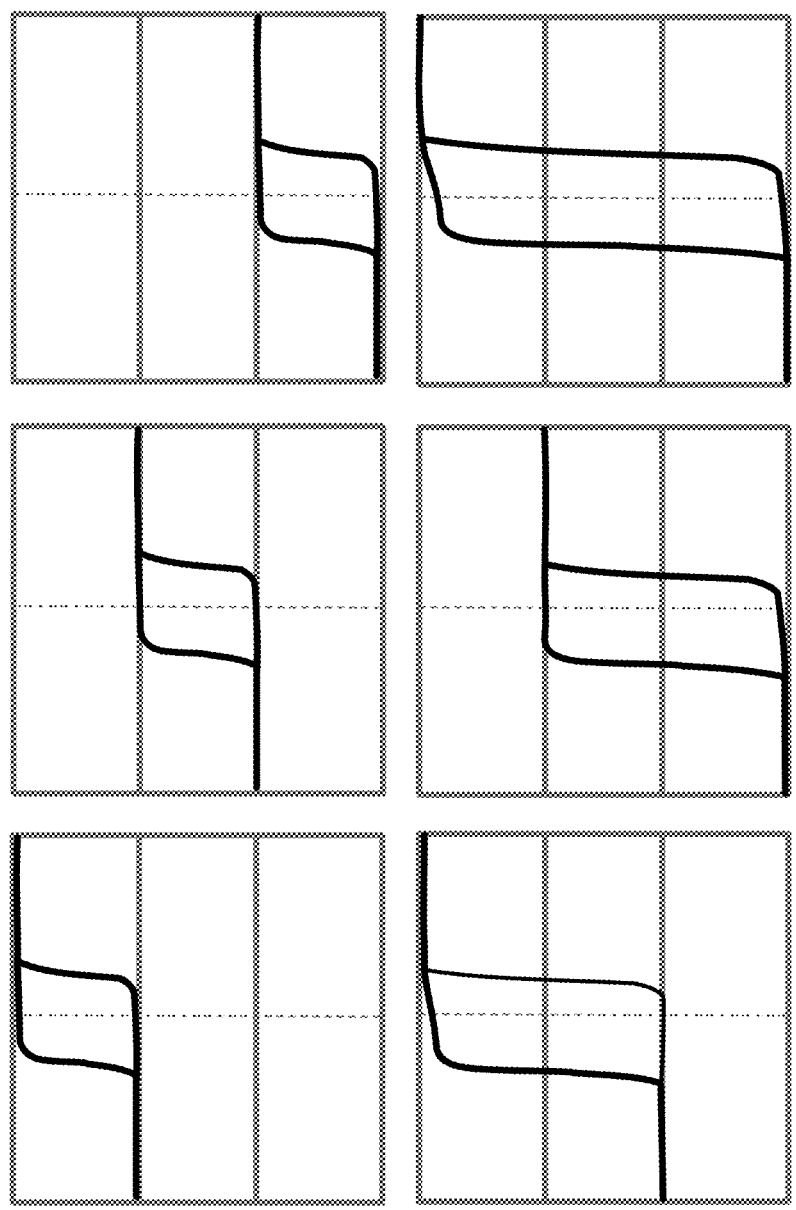
FIG. 5 shows images of six loops separated from a PAM4 cyclic loop image.

As discussed above, the cyclic loop for PAM4 signal applications is more complex than a cyclic loop for a two-level signal because there are multiple cyclic loops for a multi-level signal such as PAM4. This results from the four signal levels and the fact that edges may cover only one-level, two-level, or three-level transitions, as shown in FIG. 4. Multi-level signals like PAM4, in contrast to two-level signals like NRZ, may require the ability to display the various loops separately, as shown in FIG. 5. In the context of this disclosure, a "multi-level" signal means a signal that uses more than two levels to encode symbols.

Figure 7:
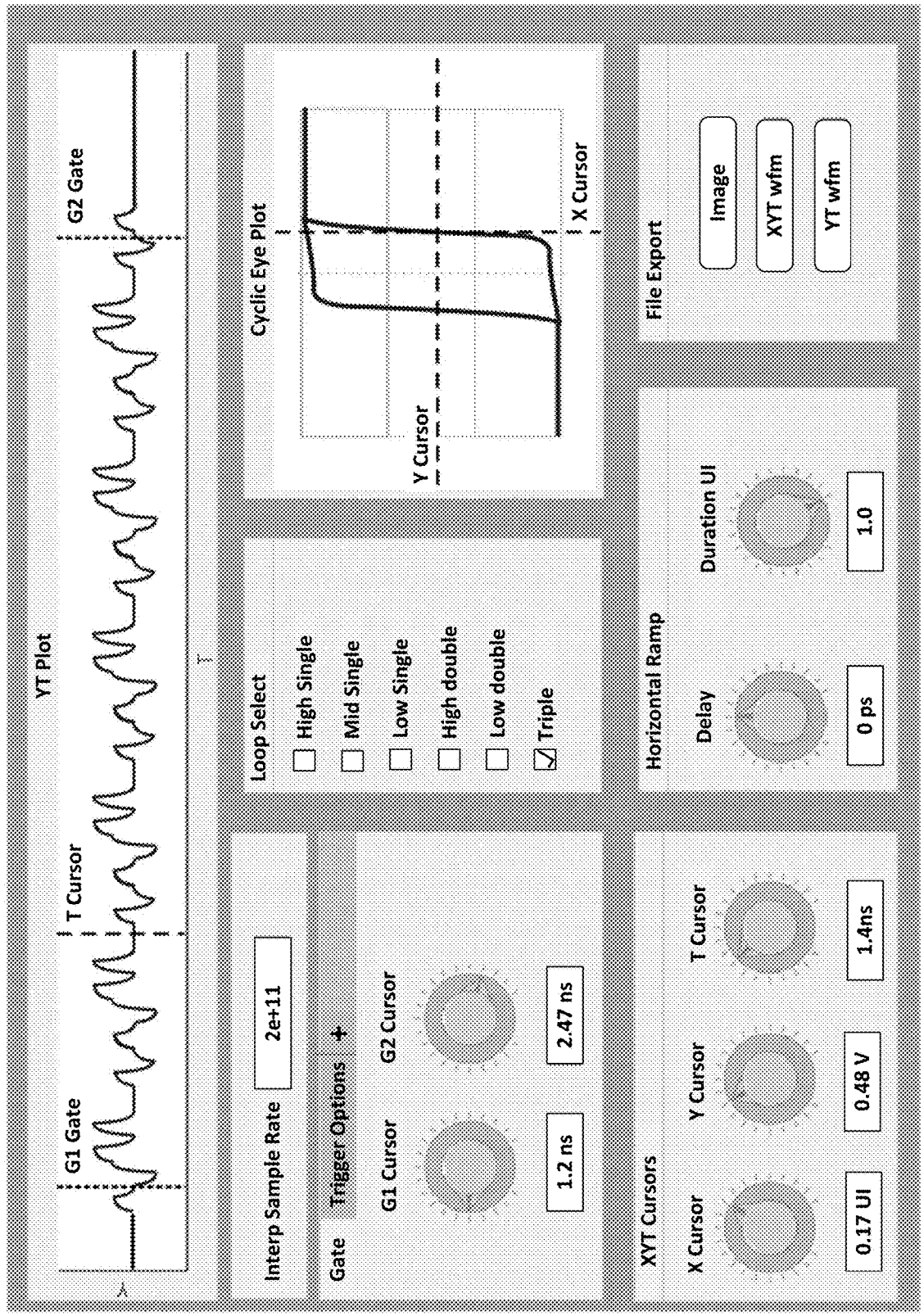
FIG. 7 shows an embodiment of a user interface menu for cyclic loop control blocks.

Any of the six cyclic loops shown in FIG. 5 can be selected and overlaid on a single plot. This includes all 6 loops included on a single plot, or any combination of some of the loops, as may be selected from a menu setup, for example. FIG. 7, discussed below, shows an embodiment of a menu.

If the ramp clock delay is less than zero, then the direction of sequencing around the loop is counter-clockwise, and the falling edges are on the upper left and the rising edges are on the lower right of the loop. One of ordinary skill in the art will recognize that the direction of sequencing around the loop may be reversed in alternative embodiments.

Figure 6:
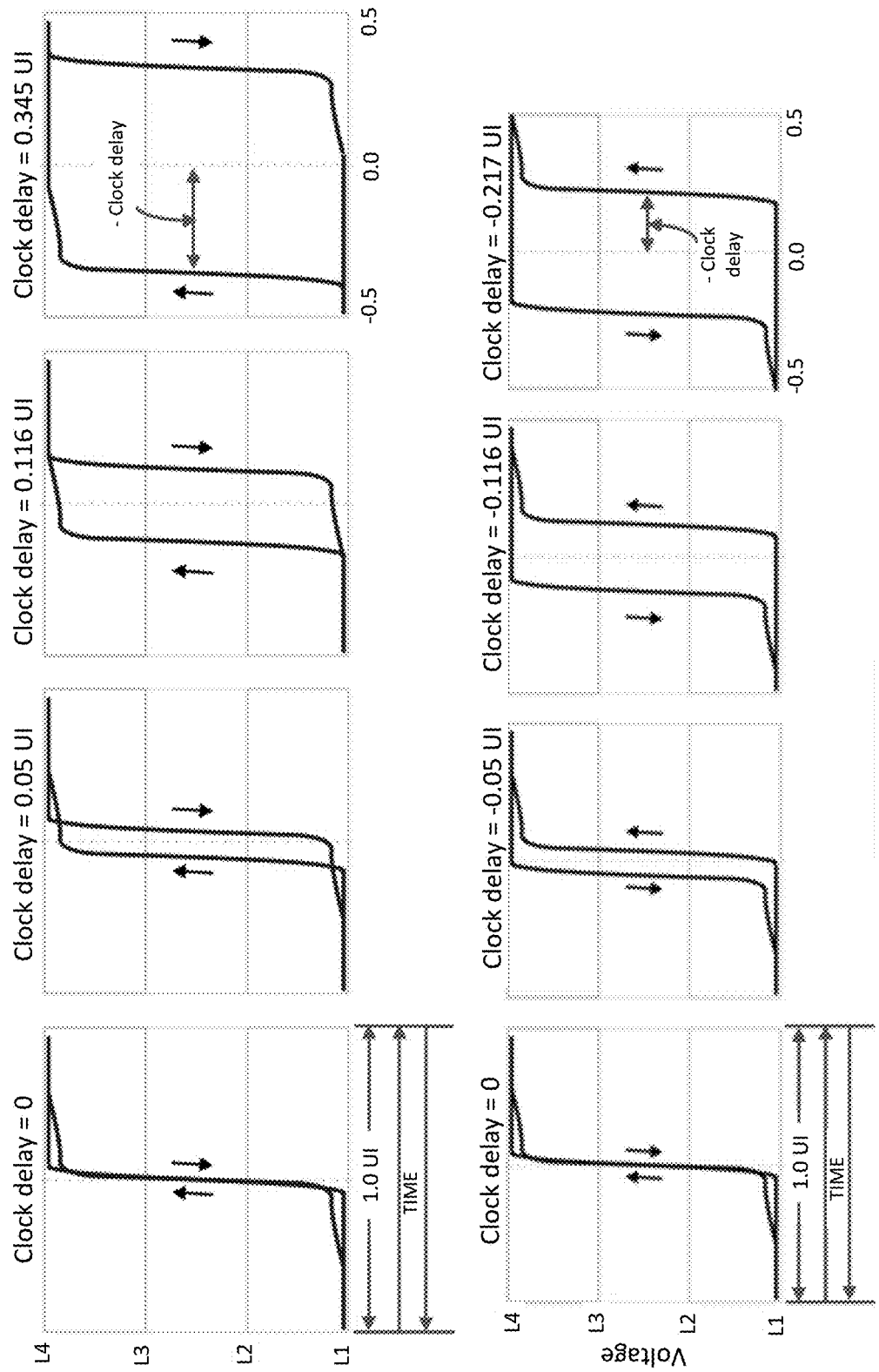
FIG. 6 shows images of different cyclic loop plots resulting from varying a horizontal ramp trigger delay.

If clock delay is zero, then the positive and negative going edges are overlaid as shown in the left plots in FIG. 6. As clock delay for the ramp trigger increases the distance between the rising and falling edges increases with the positive edges at the left and the negative edges at the right. As the ramp delay becomes negative the distance between the two edges increases again, but the negative edge is on the left and the positive edge is on the right.

As mentioned previously, a user control can be used to change this clock ramp trigger delay in order to manually separate the edges for observation, measurement, and comparison for symmetry, etc.

The cyclic loop collects a full long record length of data gated into the display. All samples in that interval are plotted into the display. The XYZ version of the acquired data may be saved and kept for use with cursors and measurements. It may be rendered into either a standard YT plot or into a cyclic loop image.

For a PAM4 signal, the vertical amplitude transitions between different levels from one UI interval to the next. There are four levels. Ramps for a sweep are only generated during the time of the PAM4 input signal edge transitions. No ramps are generated from one UI to the next when there is no edge transition. This means all data points plotted during UI intervals with no edges will appear around two localized positions at either the left side of the display or at the right side of the display, and will be at one of the four vertical levels in the PAM4 signal.

During the UI intervals where an edge transition occurs the ramp for the horizontal axis will be generated, and the edge will be plotted from left to right on the display or from right to left, depending on whether the edge is respectively positive or negative going.

The embodiments here allow the user to make selections from a menu or other user interface. FIG. 7 shows an example of such a user interface. As discussed below, this embodiment serves as one example of a user interface. No limitation to this configuration is intended nor should any be implied as the user interface may include additional controls and options or contain fewer than shown here. In addition, while the user interface provides one option, other implementations may involve cyclic loops generated by the system with no menus or user interaction. The system may automatically select the portion of the incoming waveform to use. In either instance, this user-made or automatic selection input will be referred to here as an "input" to identify the portion of the waveform to use for generating the cyclic loop image.

As shown in FIG. 7, the user interface contains the menu control structure for the PAM4 cyclic loop. This menu may be incorporated as an embedded menu in the oscilloscope application, or it may be implemented as a software application that runs independent of the oscilloscope, such as on a connected computing device. The application may control and interact with the oscilloscope. It may run on the oscilloscope processor operating system, it may run on a separate computing device, distributed between the two systems, which may have several processors each, or it may run as a web-based cloud application, etc.

The top of the user interface may show a YT plot that displays the input PAM4 waveform graphically as amplitude versus time as in a standard oscilloscope display. This plot may be the oscilloscope display, or it may be a separate plot controlled by an application. The plot may have all types of controls and settings such as for grids, zoom, colors, labels, etc., such as is expected to exist in standard waveform plots.

The user interface may show a minimum of one cyclic loop plot. However, any number of plots may exist simultaneously, each with different selections of loops included, or from different acquisitions. These plots may have all the standard parameter controls typically associated with plots. The Y-axis consists of the input signal from the gated input waveform, discussed in more detail below. The X-axis consists of the waveform containing linear ramps at UI (unit interval) positions where the input signal, y(n), has edge transitions.

The gate controls for G1 and G2 may have cursors associated with them on the YT display. These controls and associated cursors would specify the segment of the input waveform that is to be plotted into the cyclic loop. They allow the user to manually specify the gate interval to include in the cyclic loop. The second tab for "Trigger Options" may allow for any type of algorithm or any type of measurement to be used for positioning G1 and G2. This allows for automated methods to be incorporated for determining the segment of the YT waveform that will be gated into the cyclic loop. For example, it could allow the system to detect active bursts of data in one direction and detect active bursts of data in the opposite direction. The trigger may have the ability to tell which direction, or it may have the ability to recognize different bursts of data. For the latter case, neural nets may be used to analyze the cyclic loop and determine which type of burst it is.

The user interface may include X, Y, and T cursors with appropriate data value readouts at the position in the waveform sample space marked by the three cursor locations. The X and the Y cursor would exist on the XY cyclic loop plot, and the T cursor would mark the time position on the YT plot. The cursor position read outs are in the menu marked with the appropriate units. The user may control the cursors in a similar manner typical in oscilloscopes, by using a mouse or touchscreen, or a knob, or an edit box, or PI, programmable interface, commands, etc.

As discussed above, a PAM4 signal, or other multilevel signal, has multiple loops. The example user interface of FIG. 7 contains a set of six checkboxes for selecting which of the six possible cyclic loops appear on the cyclic loop image. Any combination may be checked and thereby selected to be included in the plot.

Figure 8:
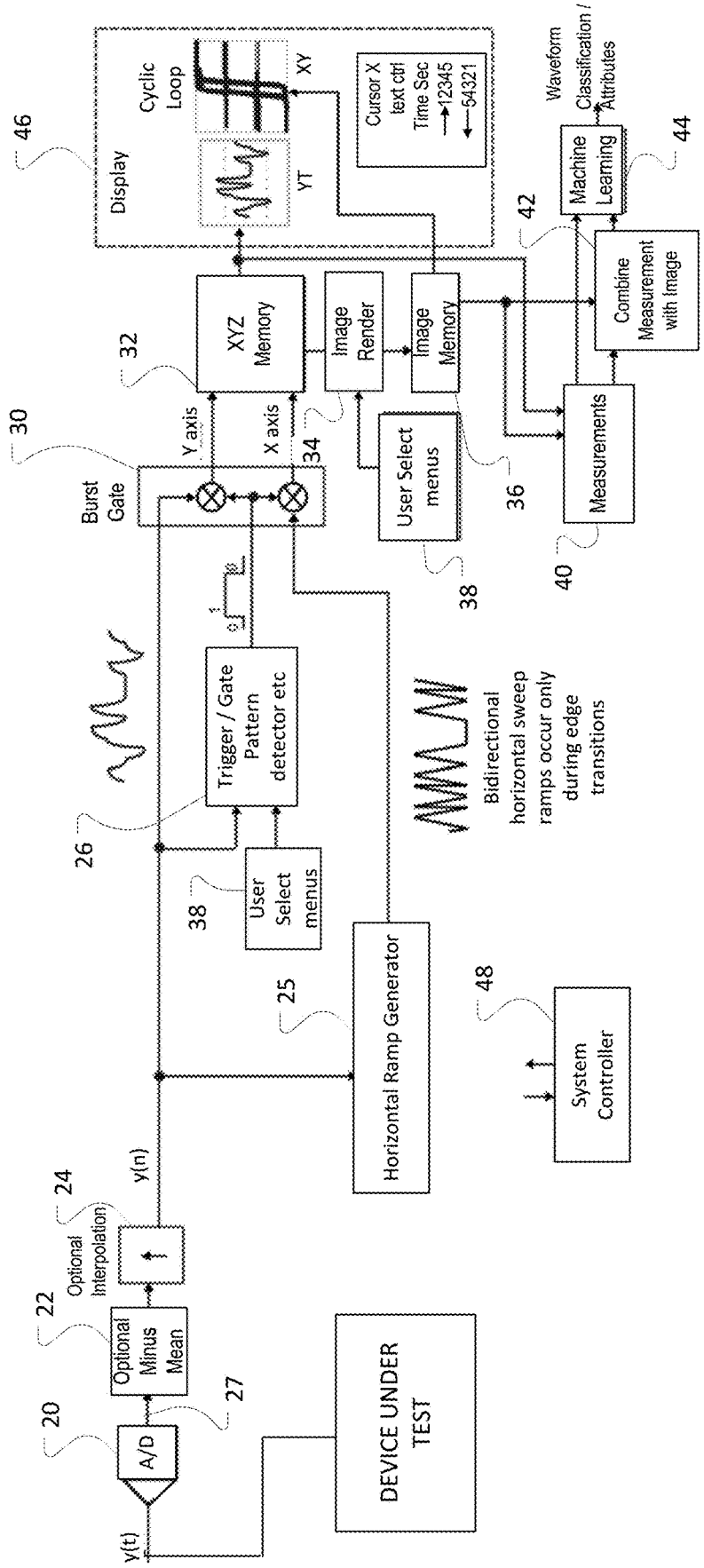
FIG. 8 shows an embodiment of a system to generate a PAM4 cyclic loop image and data.
Figure 10:
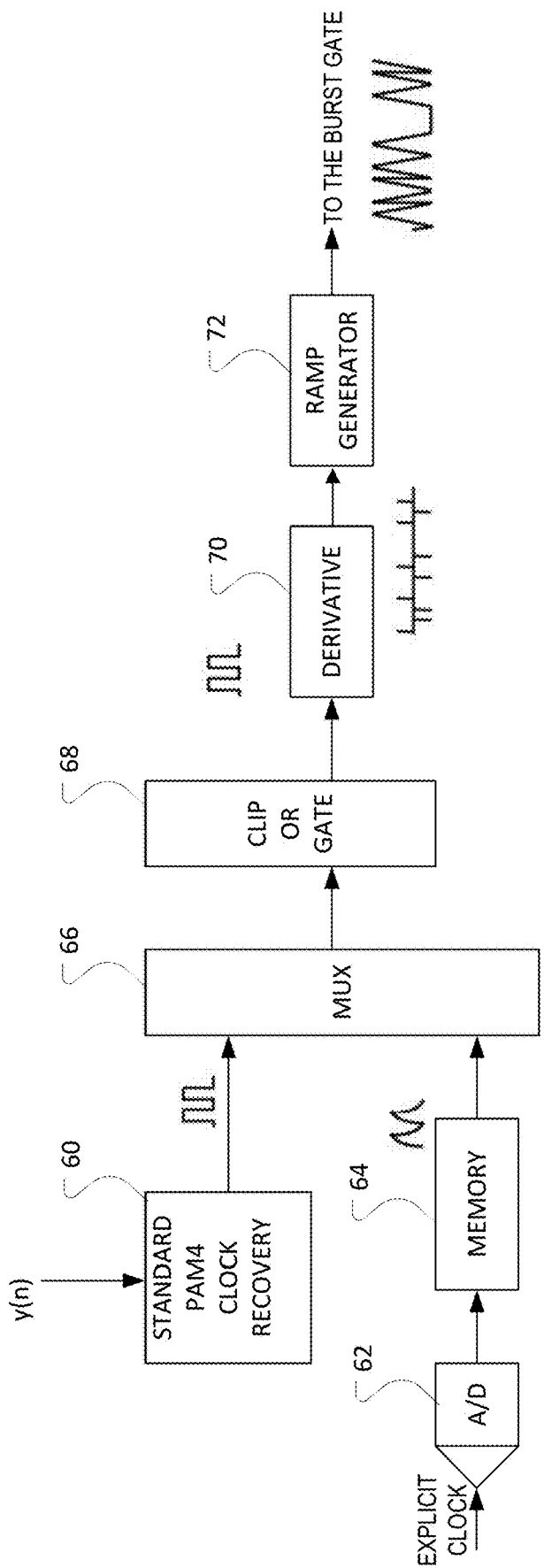
FIG. 10 shows an embodiment of a horizontal ramp sweep signal generation circuit.
Figure 11:
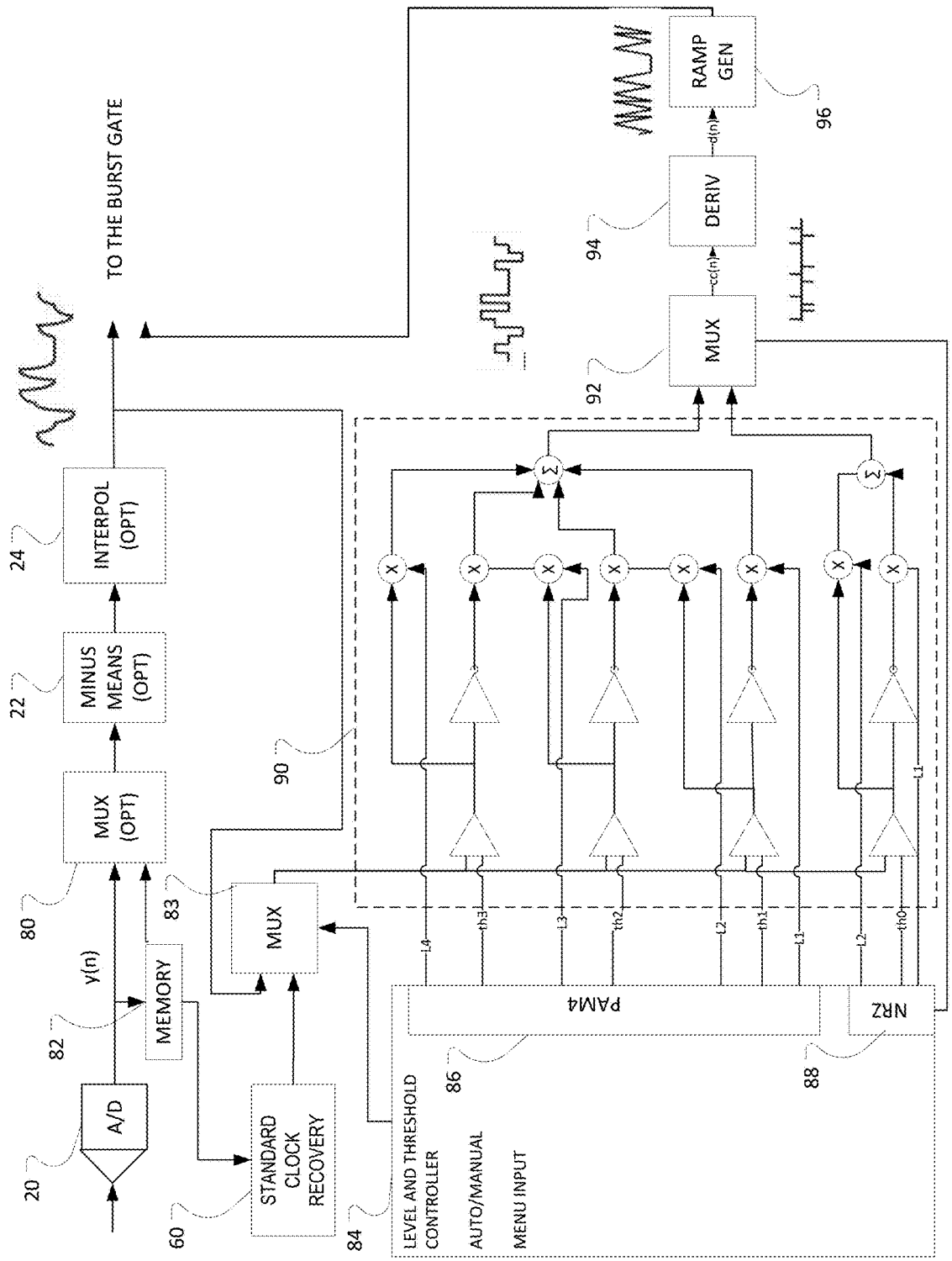
FIG. 11 shows a more detailed embodiment of a horizontal ramp sweep generation circuit including a PAM4 clipper circuit.

As discussed with regard to FIGS. 8, 10, and 11, the system generates a horizontal ramp to apply to the input waveform. The horizontal ramp control section may include a delay and duration setting. The delay allows the user to adjust the amount of time with respect to the recovered ramp trigger which determines when the ramp starts. Adjusting this control will increase or decrease the distance horizontally between the rising edges and the falling edges in the cyclic loop image to allow them to be analyzed separately, as shown in FIG. 6.

The ramp duration control adjusts the ramp duration by changing the slope. The default ramp duration is equal to one UI which is one symbol interval. However, it may be desirable to decrease the ramp time to not include the loop trace to extend to high levels for signals that have very fast rise time with respect to the width of the UI interval. This allows the edge transition to be the primary focus of the cyclic loop for purposes of machine learning and human observation. All waveform samples are still included in the cyclic loop image, but more of them are now stuck at the edges of the display image.

The file export control allows the user to export the file, such as saving the cyclic loop image, an XYT file, or a YT file.

Examples of other controls not shown in FIG. 7 may include XY and YT image zoom and pan, and interpolation sample rate. The XY plot may also have typical zoom and pan adjustments so that the images can be managed for better human observation, as well as for better machine learning resolution of the waveform edge characteristics. The interpolation control would allow the user to choose the interpolation or decimation rate. This control would adjust the sample rate of the stored waveform.

Based in part on the user selections, the system can produce a cyclic loop image and the associated data. FIG. 8 shows an embodiment of a system that can generate the cyclic loop image for display, and/or make the cyclic loop image data available to a machine learning system to allow for determination of the nature of the signal, or attributes of the signal, associated with the cyclic loop image. At 20, the analog signal is received at an input circuit. The analog signal may be from a probe attached to a device under test (DUT). The input circuit may take many forms, but will include an analog-to-digital (A/D) converter such as 20 that converts the incoming signal y(t) to a sampled, digital waveform signal y(n). In alternative embodiments, the analog-to-digital conversion stage 20 may be optional, and an input digital waveform signal y(n) may be received directly at 27, such as from a stored waveform file. The signal may undergo further processing at the input circuit, including removing the DC offset from the signal. Typically, one can accomplish this by removing the average of the signal at 22. In addition, as mentioned previously, the signal may undergo interpolation or decimation at 24 to adjust the sample rate, either to fill in the path line or to reduce the amount of data to process.

A horizontal ramp generator 25 then receives the digital waveform, to generate the ramps used as the X-axis data in the cyclic loop. This may consist of a set of operations performed by a processor that can recover a clock from the digital waveform, and/or clip and shape the data and use appropriate logic and gating to trigger linear ramps that occur during each transition in the waveform. For unit intervals in the waveform that do not have edge transitions, there will be no ramp generated. The ramps may have constant amplitude and constant slope. The slope controls the duration which defaults to one UI. The user may have a control to adjust this duration. This would be good for eliminating long high levels from the cyclic loop for waveforms that have a fast rise time with respect to the UI duration. This optimizes the view of the edges, which are the central areas of focus in a cyclic loop, as compared to the traditional eye diagram. The user may adjust the time offset of the ramp with respect to recovered clock edges as shown in the menu of FIG. 7. This allows the user to separate the edges in the cyclic loop so that rising edges do not overlay on top of falling edges and to optimize the view of the edges in the cyclic loop for purposes of measurements, and symmetry comparison. This also helps when the cyclic loop image is used in a deep learning neural network or other machine learning system for waveform image classification, or determining attributes of the waveform. FIG. 6 shows the effects of adjusting this delay.

The trigger/gate pattern detector 26 also receives the signal and the user inputs 38 from the user interface discussed in FIG. 7. The trigger/gate block allows the user to set gate cursors up on the incoming digital waveform to specify the amount and position of data that shall be incorporated into the cyclic loop display image. Other means of search and mark or automated algorithms may be employed to determine what portion of the waveform goes into the cyclic loop.

The burst gate 30 determines what data goes into the cyclic loop database, via XYZ memory 32. The gate/trigger block 26 supplies 1s or 0s to a multiplier, in this embodiment, that controls when the data starts and stops to the memory 32 and/or display 46. This is represented as multipliers in the block diagram in order to determine what data goes into the cyclic loop data base. The gate/trigger block supplies one or zero to the multiplier which controls when the data starts and stops to the memory 32 and/or display 46. The resulting portion of data may be referred to as a gated waveform, consisting of Y-axis data and X-axis data.

Figure 9:
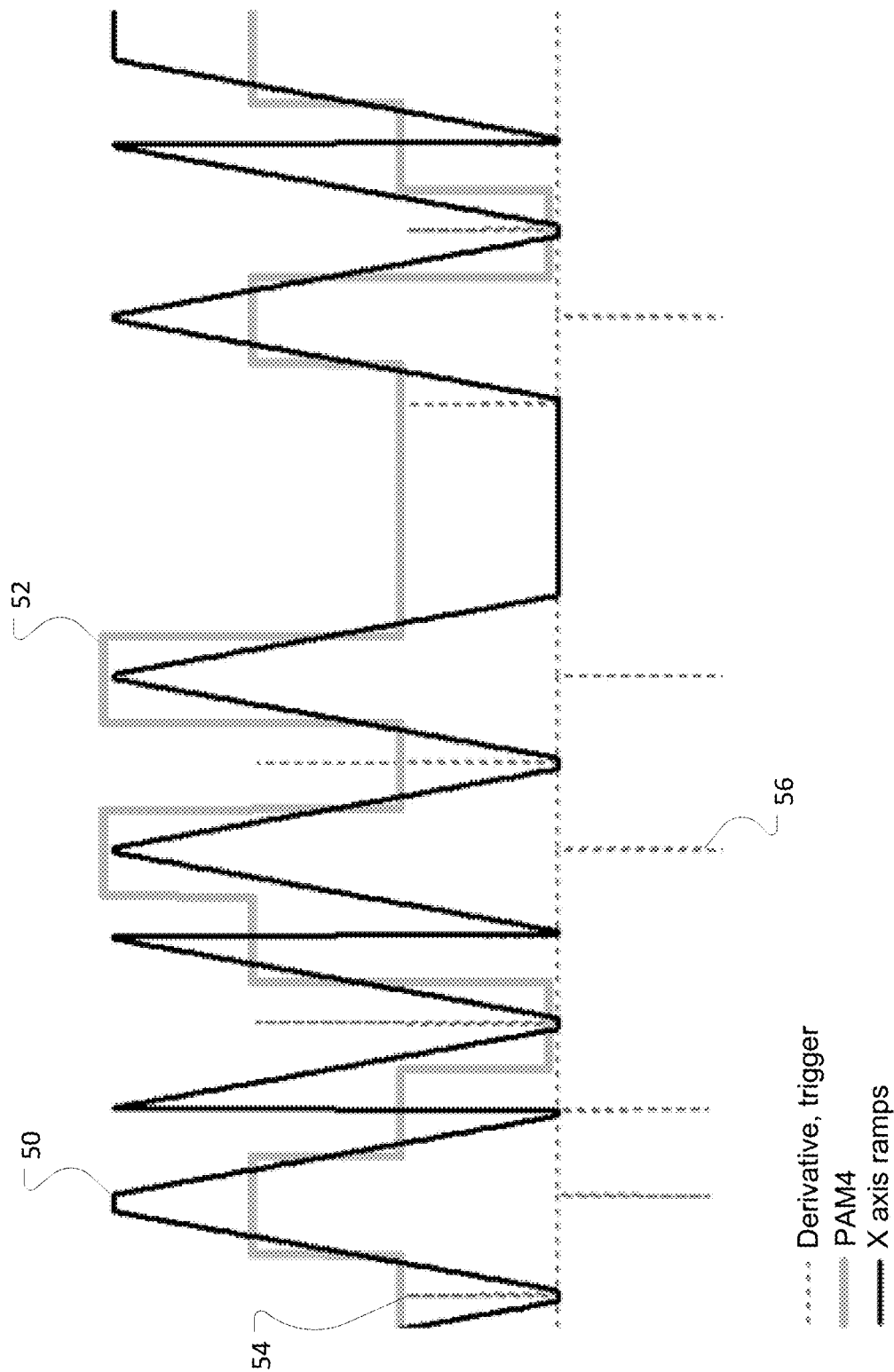
FIG. 9 shows a graphical representation of generation of a ramp signal only occurring during transitions.

FIG. 9 shows an example of a PAM4 waveform 52 and the operation of the ramp signal generator 25. The ramp signal generator 25 generates the ramp sweep signal 50 based upon the triggers 54, 56. The triggers 54, 56 result from a combination of the clock edges and the digital waveform data 52. The discussion here refers to this as a ramp sweep signal, as it comprises multiple ramps that sweep across the time interval designated for data capture. The trigger impulses are either positive 54, or negative 56. The polarity of the pulses determines the slope of the ramp to be generated as the X-axis data for the cyclic loop plot.

An XYZ memory 32 stores the gated waveform data as an XYZ data set. The X data consists of the set of ramps generated as a function of time. The Y data set consists of the input data waveform samples as a function of time. The Z data consists of the time axis increments between samples. The data set is maintained for use with cursors and measurements and waveform export functions. It is also used as the data source for rendering into a cyclic loop image database. The Z data vector can be stored as simply a single time per sample interval number, and a start value time. The array index to the other data multiplied times this sample interval plus the start value provides the time position numeric value for each sample in the YT waveform.

The image rendering block 34 may involve processing by a processor, represented by the system processor 48. The system processor may include one or more processors on a test and measurement device like an oscilloscope, a separate computing device, distributed between the two processors or more. The processors execute code that cause the processors to map the XYZ data into a cyclic loop image that can be displayed on display 46 and/or stored in memory 36. The cyclic loop image may consist of the XY data. The number of loops may be determined from the user inputs 38. The cyclic loop image may also be exported into files for input into deep learning waveform classifications algorithms or other machine learning systems at 44. The image rendering block 34 receives user input from the menu system 38 to specify which of the 6 loop paths to include in the cyclic loop image. Any combination of loops may be specified.

In addition to generating the cyclic loop image, the system may perform measurements at 40 on the XYZ memory data or on the cyclic loop image data. Some examples of measurements include rise time, fall time, reflection coefficient, reflection delay, amplitude, SNR, ISI signal due to signal loss, symmetry and non-linearity, BER (bit error ratio), loop width, loop height, jitter, TDECQ (transmitter dispersion eye closure, quaternary), and more. The system may combine the measurements with the cyclic loop image provided to the machine learning system at 42, such as by associating the measurement value(s) with the cyclic loop image as metadata.

The machine learning system 44 may be capable of receiving the cyclic loop image file, and then, for example, classifying the waveform. One example use case may be to identify read versus write cycles during transmission where the system transfer function is different between the two operations. For example, a probe point at one end of the system may see different reflection delays and different loss shapes based on a read versus a write operation. Also, it may be possible to classify the waveform in terms of other measurement such as BER or SNR or other possible measured values. The display 46 may display plots for standard YT views of the waveform and one or more XY plots of cyclic loop image data. The plots will have the standard capabilities of plots, such as zoon, cursor, markers, color, grid control, etc.

All parts of the system may be controlled by a system controller 48. This may be the main processor for the system. It may be an array of processors, or a network of processors. Alternatively, it may consist of multiple processors of potentially different forms such as FPGAs, GPUs, discrete circuitry, or a cloud-based processor, etc.

FIGS. 10 and 11 show different embodiments of the horizontal ramp generator 25. For purposes of simplifying the diagrams, FIGS. 10 and 11 only show the elements of the embodiments and how they connect to the rest of the overall system.

FIG. 10 shows a second analog-to-digital converter 62 to receive an external explicit clock input, and the digitized clock input may be stored in a memory 64. This clock edge changes on each UI. However, any ramp trigger pulse positions based on this clock would have to be gated by logic based on the PAM4 levels and symbol sequence. The standard PAM4 clock recovery 60 represents a clock recovery system. The recovered clock edges occur for each UI. However, any ramp trigger pulse positions based on this clock would have to be gated by logic based on the PAM4 levels and symbol sequence. A clock multiplexer 66 selects between the explicit clock and the recovered clock. The clipper or gate 68 creates the ramp trigger position. However, the input explicit clock or the PAM4 recovered clock would result in triggers on all clock transitions. This block 68 may take the form of logic circuitry, or may be implemented in code executed by a processor.

The block 68 looks at the incoming y(n) signal and determines if a clock edge should be passed through or not. Then the resulting output signal would have positive going trigger impulses, to trigger positive going ramps from low to high. If the impulses are negative, then a negative ramp going from high to low shall be generated. No trigger pulses would occur if there was no edge transition for that UI in the y(n) signal.

The derivative block 70 ensures that the clock edges and levels that are gated as true are transformed into trigger impulses for each clock edge. The derivative signal produced by block 70 will return to zero after each clock edge. This creates a stream of trigger impulses marking the reference position for each ramp which is to be generated. Polarity of the impulse indicates the slope of the ramp. A positive impulse results in a positive slope and a negative impulse results in negative slope as shown in FIG. 9.

For this system, the ramp generator 72 receives the stream of trigger impulses. It generates a positive ramp from low to high when the trigger impulse is positive. It generates a negative ramp from high to low when the trigger impulse is negative. When there is no edge transition in a UI the ramp output remains either high or low depending on what it was for the previous UI. This is because no trigger impulses are created for these intervals. If it was high, then the output remains high. If it was low, then the output remains low. The resulting signal from 72 then goes to the burst gate 30 shown in FIG. 8.

FIG. 11 shows an alternative embodiment of the horizontal ramp generator 25. An optional multiplexer 80 indicates that the input signal y(n) may be a continuous live stream from the output of the analog-to-digital converter 20, or it may be sourced from an acquisition memory such as 82. The memory 82 represents storage for intermediate waveform results. Memory 82 may be a centralized memory, or may represent several different memories distributed throughout the system. If a system is designed for live stream, then waveform memories would not be used, and all of the processes would occur in the time between samples. Live stream would only be practical for lower sample rates with respect to processor speed.

Another multiplexer 83 can be used to select whether the ramp triggers are derived directly from the input signal, y(n), or whether a recovered clock shall be used. For the system embodiments of FIG. 11, the recovered clock switches for every UI and would only be used for the NRZ type of input signal. Another multiplexer 92 selects whether the output of the NRZ clipper is used or whether the output of the PAM4 clipper is used in determining ramp trigger positions. The embodiments here may be scaled to more, or fewer, levels and thresholds, even though the example discussed is for PAM4 with four levels and three thresholds.

Figure 12:
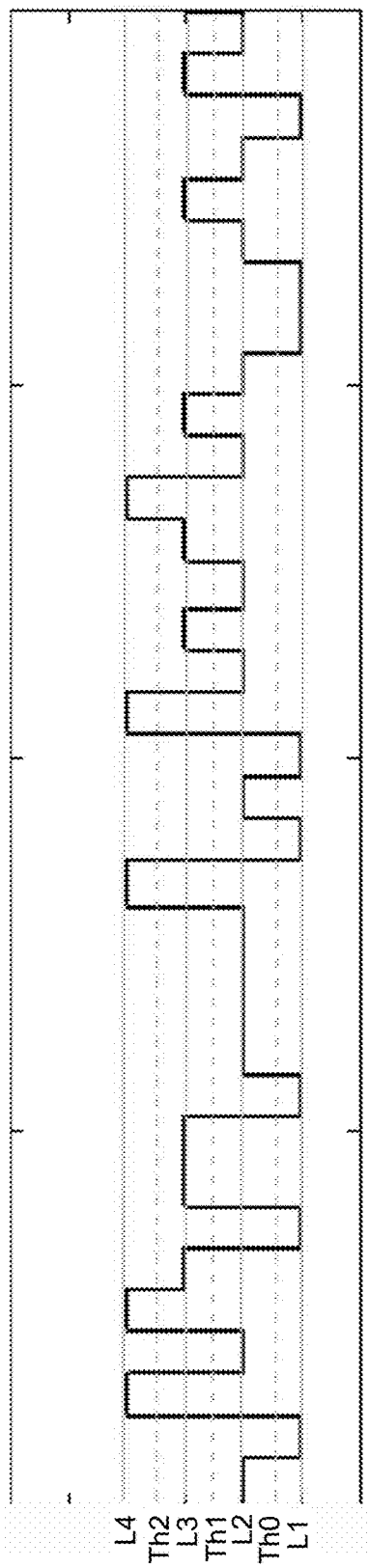
FIG. 12 shows a graphical representation of an output signal from a PAM4 clipper block.

Block 90 shows an embodiment of what will be referred to here as a PAM4 Clipper. The clipper converts the incoming waveform with ISI and noise, into a clean and square-looking PAM4 signal. The output signal of the PAM4 clipper still contains the four PAM4 levels and transitions. This is key, because this is the mechanism that allow ramps to only be triggered during UI intervals when edge transitions are present, and no ramp is generated during intervals that have no transitions. The PAM4 clipper receives, from the PAM4 control block 86 in the level and threshold controller 84, input parameters, typically voltage levels, representing the four levels of the PAM4 signal, L1-L4, and the three threshold levels, th1, th2, th3, where the transition from level to level occurs, as shown in FIG. 12. The PAM4 clipper also receives as input the y(n) input signal from the output of mux 83. The PAM4 clipper may also receive NRZ signals 88 from the level and threshold controller 84. The input signal y(n) is then processed according to the comparators and logic that are shown as a combination of comparators, inverters, multipliers, and a summer. The output of the summer is the ideal clean version of the PAM4 signal. The logical equation in Mathcad format for the PAM4 clipper output signal, cc(n), is represented as:

$$cc_n := (y_n \leq th1) \cdot L1 + [(y_n > th1)\hat{}(y_n \leq L2)] \cdot L2 + [(y_n > L2)$$
$$\hat{}y_n \leq th2] \cdot L2 + [(y_n > th2)\hat{}(y_n \leq L3)] \cdot L3 + [(y_n > L3)$$
$$\hat{}y_n \leq th3] \cdot L3 + (y_n > th3) \cdot L4$$

The derivative of the cc waveform shown in FIG. 12 is then computed as shown at 94. This creates a positive going impulse everywhere a positive transition of cc occurs. It creates a negative going transitions everywhere a negative transition occurs in cc. The derivative waveform is zero everywhere else. This creates the trigger spikes for the ramp generator 96. No trigger spikes occur in UI intervals where no transitions occur.

Figure 13:
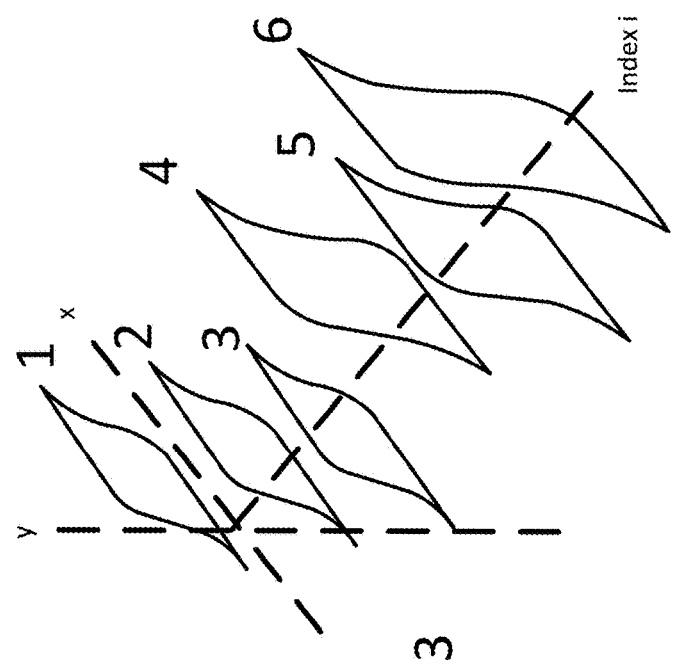
FIG. 13 shows a graphical representation of an embodiment of a tensor input to a machine learning system.

The cyclic loop images make useful inputs to a machine learning system. The cyclic loop images can be organized or formed into separate elements of a tensor. FIG. 13 shows a graphical representation of a cyclic loop image tensor with 6 XY cyclic loop images organized along an index, i, of the tensor. Each of the six images may be, for example, a cyclic loop image for one of the six possible cyclic loops for a PAM4 signal. Or, in another example, each of the six images may be the same one of the six possible cyclic loops for a PAM4 signal, but each obtained from six different DUTs. The shapes of the edges in each cyclic loop image represent the transfer function of the system, so separating them out makes the transfer function more distinguishable to the machine learning system than a classic eye diagram. Each cyclic loop image for each PAM4 cyclic loop resides in its own layer to isolate the data in each image from the other. The traditional eye diagram has all of the edges overlaid and interfering with each other.

Figure 14:
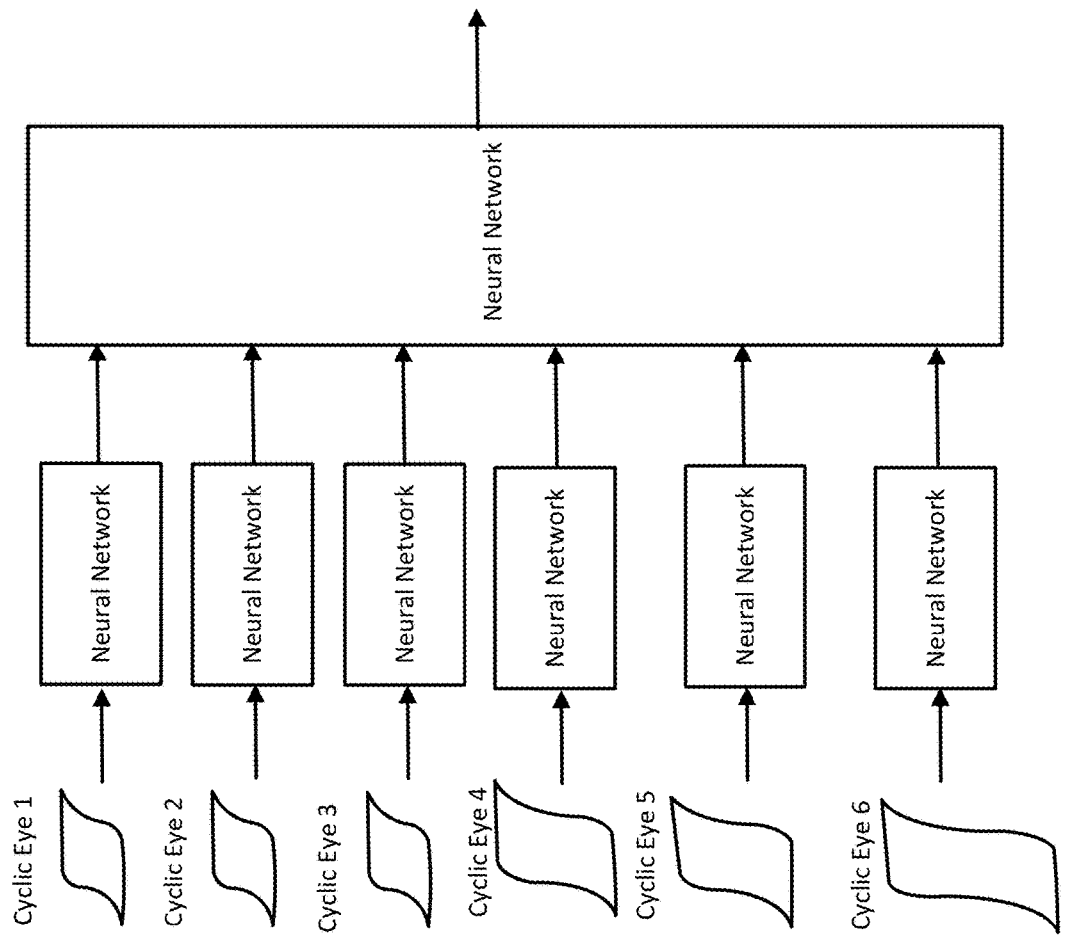
FIG. 14 shows an embodiment of a configuration for incorporating cyclic loop images into machine learning.

FIG. 14 shows an alternative configuration for inputting multiple cyclic loop images into a machine learning system. In FIG. 14, each cyclic loop image 1-6 from FIG. 13 acts as an input to an individual first-level neural network as feature extractors. A second-level neural network then combines the outputs of the first-level neural networks for further processing and analysis.

In this manner, a cyclic loop diagram of XY data, using y(n) sample data combined with horizontal ramp data, is created. The diagram contains less data, but possibly more information, than traditional eye diagrams. The system can then provide these diagrams and their associated data to a machine learning system.

Aspects of the disclosure may operate on a particularly created hardware, on firmware, digital signal processors, or on a specially programmed general-purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description refers to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a system comprising an input to receive a digital waveform signal, a memory, and one or more processors configured to execute code to cause the one or more processors to: generate a horizontal ramp sweep signal based on the digital waveform signal; receive a selection input to identify a segment of the digital waveform signal; gate the horizontal ramp sweep signal and the digital waveform signal based on the selection input to produce cyclic loop image data for the segment of the digital waveform; store the cyclic loop image data in the memory; and provide the cyclic loop image data as one or more inputs into a machine learning system.

Example 2 is the system of Example 1, wherein the memory comprises an XYZ memory to store the horizontal ramp sweep signal as a function of time as X-axis data, the digital waveform signal as a function of time as Y-axis data, and time axis time increments between data samples as Z-axis data.

Example 3 is the system of one of either Examples 1 or 2, wherein the digital waveform signal comprises a digitized representation of a signal modulated according to a multi-level modulation scheme acquired from a device under test.

Example 4 is the system of any of the Examples 1 through 3, wherein the one or more processors reside on a single computing device or distributed between a computing device and a test and measurement instrument.

Example 5 is the system of any of the Examples 1 through 4, wherein the input comprises an input circuit including an analog-to-digital converter to receive an analog input signal from a device under test and produce the digital waveform signal.

Example 6 is the system of any of the Examples 1 through 5, a subtraction block to remove a DC offset from the digital waveform signal, and an interpolator to adjust a sample rate of the digital waveform signal.

Example 7 is the system of any of the Examples 1 through 6, wherein the one or more processors are further configured to execute code to cause the one or more processors to perform a measurement on the cyclic loop image data.

Example 8 is the system of claim 7, wherein the one or more processors are further configured to execute code to cause the one or more processors to combine the cyclic loop image data with the measurement prior to providing the cyclic loop image data to the machine learning system.

Example 9 is the system of any of the Examples 1-7, further comprising an external clock input to receive an external clock, a clock analog-to-digital converter to produce a digital external clock, a clock recovery circuit to produce a recovered clock, and a multiplexer to select between the digital external clock and the recovered clock.

Example 10 is any of the Examples 1-9, wherein the code to cause the one or more processors to provide the cyclic loop image data to the machine learning system comprises code to cause the one or more processors to form a tensor of a plurality of cyclic loop images and to provide the tensor as an input to the machine learning system.

Example 11 is any of the Examples 1-10, wherein the one or more processors are further configured to execute code to cause the one or more processors to render the cyclic loop image data on the display as one or more cyclic loop images.

Example 12 is a method of waveform classification using a cyclic loop image, comprising: receiving an input waveform, receiving a selection of a segment of the input waveform; transforming the segment of the input waveform into cyclic loop image data, the transforming comprising generating a horizontal ramp sweep signal based on edge transitions in the input waveform; storing the cyclic loop image data in a memory; and sending the cyclic loop image data to a machine learning system to determine an attribute of the input waveform.

Example 13 is the method of Example 12, further comprising rendering the cyclic loop image data as one or more cyclic loop images on a display.

Example 14 is the method of Example 13, wherein the input waveform comprises a digitized representation of a signal modulated according to a multi-level modulation scheme acquired from a device under test, the method further comprising: receiving a selection of one or more cyclic loops for the multi-level modulation scheme; and rendering only the selected cyclic loops as the cyclic loop image on the display.

Example 15 is the method of any of the Examples 11-14, further comprising performing a measurement on the cyclic loop image data.

Example 16 is the method of any of the Examples 11-15, further comprising combining the measurement and the cyclic loop image data prior to sending the cyclic loop image data to the machine learning system.

Example 17 is the method of any of the Examples 11-16, further comprising at least one of: receiving an analog input signal from a device under test and using an analog-to-digital converter to convert the analog input signal into a digital signal as the input waveform; subtracting a mean of the input waveform to produce the input waveform without a DC offset; and interpolating the input waveform to adjust a sample rate of the input waveform.

Example 18 is the method of and of the Examples 11-17, wherein generating the horizontal ramp sweep signal based on edge transitions in the input waveform comprises selectively sending a trigger signal based upon the edge transitions.

Example 19 is the method of and of the Examples 11-18, wherein transforming the segment of the input waveform into cyclic loop image data further comprises receiving a horizontal ramp clock delay.

Example 20 is a system, comprising: an input circuit to receive an input waveform signal from a device under test, the input circuit including an analog-to-digital converter to produce a digital waveform signal; a selection input to identify a segment of the digital waveform signal; a ramp signal generator to generate a horizontal ramp signal based upon data in the segment of the digital waveform signal; a trigger to trigger capture of data samples in the segment of the digital waveform signal associated with the horizontal ramp sweep signal as gated waveform signal data; a display to display the gated waveform signal data as one or more cyclic loop images; and a machine learning system to use one or more cyclic loop images as input.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific aspects of the disclosure have been illustrated and described for purposes of illustration, it will be understood that various modifications may be made without departing from the spirit and scope of the disclosure. Accordingly, the disclosure should not be limited except as by the appended claims.

The invention claimed is:

1. A system, comprising:
    an input to receive a digital waveform signal;
    a memory; and
    one or more processors configured to execute code to cause the one or more processors to:
        generate a horizontal ramp sweep signal based on the digital waveform signal;
        receive a selection input to identify a segment of the digital waveform signal;
        gate the horizontal ramp sweep signal and the digital waveform signal based on the selection input to produce cyclic loop image data for the segment of the digital waveform;
        store the cyclic loop image data in the memory; and
        provide the cyclic loop image data as one or more inputs into a machine learning system.

2. The system as claimed in claim 1, wherein the memory comprises an XYZ memory to store the horizontal ramp sweep signal as a function of time as X-axis data, the digital waveform signal as a function of time as Y-axis data, and time axis time increments between data samples as Z-axis data.

3. The system as claimed in claim 1, wherein the digital waveform signal comprises a digitized representation of a signal modulated according to a multi-level modulation scheme acquired from a device under test.

4. The system as claimed in claim 1, wherein the one or more processors reside on a single computing device or distributed between a computing device and a test and measurement instrument.

5. The system as claimed in claim 1, wherein the input comprises an input circuit including an analog-to-digital converter to receive an analog input signal from a device under test and produce the digital waveform signal.

6. The system as claimed in claim 1, wherein the input comprises at least one of:
    a subtraction block to remove a DC offset from the digital waveform signal; and
    an interpolator to adjust a sample rate of the digital waveform signal.

7. The system as claimed in claim 1, wherein the one or more processors are further configured to execute code to cause the one or more processors to perform a measurement on the cyclic loop image data.

8. The system as claimed in claim 7, wherein the one or more processors are further configured to execute code to cause the one or more processors to combine the cyclic loop image data with the measurement prior to providing the cyclic loop image data to the machine learning system.

9. The system as claimed in claim 1, further comprising:
an external clock input to receive an external clock;
a clock analog-to-digital converter to produce a digital external clock;
a clock recovery circuit to produce a recovered clock; and
a multiplexer to select between the digital external clock and the recovered clock.

10. The system as claimed in claim 1, wherein the code to cause the one or more processors to provide the cyclic loop image data to the machine learning system comprises code to cause the one or more processors to form a tensor of a plurality of cyclic loop images and to provide the tensor as an input to the machine learning system.

11. The system as claimed in claim 1, further comprising a display, wherein the one or more processors are further configured to execute code to cause the one or more processors to render the cyclic loop image data on the display as one or more cyclic loop images.

12. A method of waveform classification using a cyclic loop image, comprising:
receiving an input waveform;
receiving a selection of a segment of the input waveform;
transforming the segment of the input waveform into cyclic loop image data, the transforming comprising generating a horizontal ramp sweep signal based on edge transitions in the input waveform;
storing the cyclic loop image data in a memory; and
sending the cyclic loop image data to a machine learning system to determine an attribute of the input waveform.

13. The method as claimed in claim 12, further comprising rendering the cyclic loop image data as one or more cyclic loop images on a display.

14. The method as claimed in claim 13, wherein the input waveform comprises a digitized representation of a signal modulated according to a multi-level modulation scheme acquired from a device under test, the method further comprising:
receiving a selection of one or more cyclic loops for the multi-level modulation scheme; and
rendering only the selected cyclic loops as the cyclic loop image on the display.

15. The method as claimed in claim 12, further comprising performing a measurement on the cyclic loop image data.

16. The method as claimed in claim 15, further comprising combining the measurement and the cyclic loop image data prior to sending the cyclic loop image data to the machine learning system.

17. The method as claimed in claim 12, further comprising at least one of:
receiving an analog input signal from a device under test and using an analog-to-digital converter to convert the analog input signal into a digital signal as the input waveform;
subtracting a mean of the input waveform to produce the input waveform without a DC offset; and
interpolating the input waveform to adjust a sample rate of the input waveform.

18. The method as claimed in claim 12, wherein generating the horizontal ramp sweep signal based on edge transitions in the input waveform comprises selectively sending a trigger signal based upon the edge transitions.

19. The method as claimed in claim 12, wherein transforming the segment of the input waveform into cyclic loop image data further comprises receiving a horizontal ramp clock delay.

20. A system, comprising:
an input circuit to receive an input waveform signal from a device under test, the input circuit including an analog-to-digital converter to produce a digital waveform signal;
a selection input to identify a segment of the digital waveform signal;
a ramp signal generator to generate a horizontal ramp signal based upon data in the segment of the digital waveform signal;
a trigger to trigger capture of data samples in the segment of the digital waveform signal associated with the horizontal ramp sweep signal as gated waveform signal data;
a display to display the gated waveform signal data as one or more cyclic loop images; and
a machine learning system to use one or more cyclic loop images as input.

* * * * *